BISTABLE SEMICONDUCTOR SWITCHING DEVICE

Filed March 3, 1966

United States Patent Office 3,469,154

Patented Sept. 23, 1969

3,469,154
BISTABLE SEMICONDUCTOR SWITCHING DEVICE

Magne Fredslund Scholer, Nordborg, Denmark, assignor to Danfoss A/S, Nordborg, Denmark, a company of Denmark Filed Mar. 3, 1966, Ser. No. 531,497
Claims priority, application Germany, Mar. 3, 1965, D 46,666
Int. Cl. H01l 3/00, 5/00
U.S. Cl. 317—234 4 Claims

ABSTRACT OF THE DISCLOSURE

A barrierless, junctionless semiconductor switching element normally having a high resistance. Current flowing through the semiconductor material, when in its high resistance state, is distributed essentially uniformly over the entire cross sectional area of the material, which has a negative temperature coefficient in a first range of temperatures and then slightly positive in a further range of higher temperatures, such that if at any place across the area of the material resistance is decreased, for example due to increased current therethrough as the voltage thereacross is raised, the current will concentrate in the region of a predetermined path. The current concentration raises the temperature of the current path which further lowers in resistance and the entire switch element switches rapidly from a high resistance to a low resistance state.

The present invention relates to a semi-conductor switching element and more particularly to such an element which has a high resistance and a low resistance condition.

Semi-conductor switching elements capable of switching from a high resistance to a low resistance condition are known. An example are the well known five-layer diodes, which consist of layers of semi-conductor material separated by junctions. The switching function of these elements depends primarily on the barrier or junction layers. If the barrier or junction layers are overloaded, then such switching elements are destroyed. The manufacture of such five-layer diodes is comparatively complicated and thus the cost of such diodes is high.

It is an object of the present invention to provide a semi-conductor switching element which is simple to manufacture and essentially immune against destruction due to overload.

Briefly, the invention relates to a semi-conductor element which does not utilize a junction layer or a barrier layer and which is composed of a material having normally high resistance. Current flowing through the material, when it is in its high resistance state, is distributed essentially uniformly over the entire cross sectional area of the material. The material has a negative temperature coefficient of resistance such that if at any place across the area of the material the resistance is decreased, for example due to increased current through the material as the voltage thereacross is raised, the current will concentrate in the region of a predetermined path; this concentration of current raises the temperature of this path which, since the material has a negative temperature coefficient of resistance, further lowers its resistance and thus the entire element switches rapidly from a high resistance to a low resistance state. Elements of this kind can be manufactured inexpensively, since it is not necessary to form a special junction. The element itself may be made by sintering semi-conductor material, or permitting a melt thereof to solidify on a substrate which at the same time may form the electrode. The semi-conductor material may also be evaporated on a substrate.

The negative temperature coefficient material can be subject to a localized increase in temperature, causing localized decrease in resistance, in order to predetermine the path of increased current. This increased current flowing over this path causes an increase in temperature with respect to the surrounding material, further decreasing the resistance of this path. Thus, automatically, a current path having very small cross sectional area is formed. The resistance may be in the order of 1 ohm, whereas the surrounding material may retain the original low temperature resistance of several megohms. As the current increases through the path, surrounding material is also heated. Thus, the current path increases its own cross sectional area. The entire resistance of the semi-conductor element as seen from the electrodes, thus decreases with increasing current therethrough, so that the average voltage drop thereacross is substantially constant. Increased current through the path thus essentially only extends the area of heavy current flow through the material.

Localized decrease of resistance, necessary to initiate the switching process, can be achieved in various ways. For example, an outside or external field can be capacitatively on inductively coupled to the element to cause a localized temperature increase within the semi-conductor material. In most instances, however, it is recommended to cause the localized heating to occur by means of the applied potential. Initially, the quiescent current flowing through the semi-conductor switching material, when it is in its high resistance state, determines a certain, and uniform heating of the semi-conductor material. As the potential, and thus the quiescent current, is increased, a certain threshold value will be obtained at which the heat dissipation of the interior portions of the semi-conductor material is not rapid enough to prevent an increase in temperature. At this point of the threshold value of potential, switching occurs. This switching is extremely rapid. The semi-conductor switching element can readily switch at each half wave of an applied alternating current potential of higher frequencies.

It is desirable that the current density within the internal portion of the material is kept low, that is to increase the cross sectional area through which the current flows. Thus, a larger region of semi-conductor material is utilized for passage of the current. This can be achieved by so arranging the composition of the semi-conductor material that beyond a certain limit of temperature the material has a positive temperature coefficient of resistance. Thus, if a portion of the low resistance path carries a higher current density, increasing the temperature beyond a certain value, the resistance of these portions will remain constant, or even increase, causing the current to spread over adjacent regions. Thus, a limitation of the maximum operating temperature is automatically achieved, by spreading the area of the current path.

The time constant for the switching can be decreased to a particularly low value when the semi-conductor material has low heat conductivity. Thus, the heat generated within the semi-conductor material is not conducted to the outside or ambient region readily, and the operating state of temperature necessary for the switching function is rapidly achieved.

If comparatively large semi-conductor bodies are used to switch greater amounts of power, then the internal portion of the body may retain or store heat, and the switching functions will be dependent upon the prior operating conditions of the element. This difficulty can be avoided when the portion of semi-conductor material located between the electrodes is in a form of a strip. In a structural embodiment, semi-conductor material is evaporated on a plate electrode; the second electrode is in form of a strip which may be straight or bent, for example in C-shape and placed over the evaporated layer of semi-conductor material. Thus, the path of the current will occur in a region below the strip electrode, enabling radiation of heat from such a strip-formed path in all directions.

In order to predetermine the location of the path of current at which the switching function is initiated, the distance between the electrodes can be made smaller at one point, for example by depressing a portion of the strip electrode into the material. Thus, a fixed point for the localized increase in temperature is provided, and all other design features can be arranged with respect to this point.

The structure, organization and operation of the invention will now be described more specifically in the following detailed description with reference to the accompanying drawings, in which.

Figure 1:
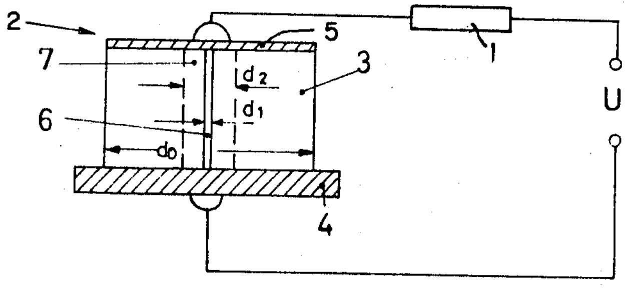
FIG. 1 shows, schematically, a semi-conductor switching element in a circuit.

Referring now to the drawings, and in particular to FIG. 1: Semi-conductor switching element 2 is connected over a load resistance 1 to a source of potential U, which can be varied and is for example an automatic current source. Semi-conductor switching element 2 consists of a cylindrical body of a semi-conductor material 3, applied to a plate electrode 4 and covered by another plate electrode 5.

Figures 2, 3, 4, 5:
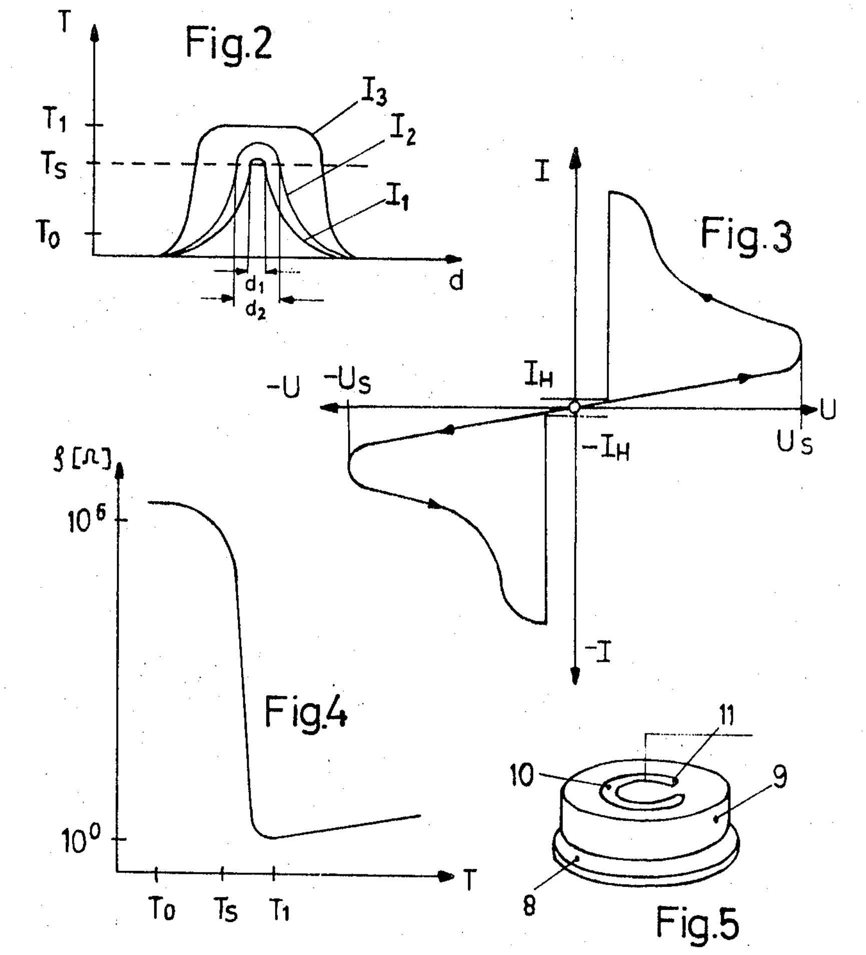
FIG. 2 is a diagram of temperature within the element at different loadings, wherein the abscissa represents the cross sectional dimension and the ordinate temperature.
FIG. 3 is a voltage (abscissa) vs. current (ordinate) diagram.
FIG. 4 is a diagram illustrating dependence of the resistance of the material on the temperature, wherein the abscissa is absolute temperature and the ordinate specific resistance.
FIG. 5 illustrates an element in accordance with the present invention having a strip electrode.

The specific resistance $\rho$ of the semi-conductor material depends on the temperature T, as shown in FIG. 4. At room, or ambient temperature $T_0$, the specific resistance is in the order of megohms. In the initial region, the material has a negative temperature coefficient of resistance, that is it decreases as the temperature increases. The lowest value, in the order of 1 ohm, is at at temperature $T_1$. At that point, the temperature coefficient becomes positive, and the resistance increases with increasing temperature.

Upon application of a relatively low potential to the semi-conductor element 2, a small quiescent current flows through the element—small due to the high resistance of the unit—which extends essentially uniformly over the entire region indicated by the diameter $d_0$ of body 3 (FIG. 1). The thus generated heat is so small that it can be easily dissipated toward the outside of the material, so that the temperature level throughout the body is substantially uniform.

Upon the increase of the potential of source U, the quiescent current extending throughout the entire cross sectional area of the body 3 increases, and thus the heat itself increases. It eventually reaches a point at which the outer portions of the body 3 can only radiate the heat generated within these outer portions themselves, but can no longer conduct the heat from the central region of the body 3. Thus, a localized increase in temperature will occur somewhere and essentially within the region of diameter $d_1$. This means, that the path 6 defined by the diameter of $d_1$ will have a smaller resistance than all other possible paths within the body 3. Thus, a larger portion of the current will flow through path 6, causing a still greater increase in heating. The effect is cumulative, and the element will switch to its low resistance state. Finally, the entire current will flow through this path 6 and a state of equilibrium will result in which the heat generated within path 6 is just sufficient in order to maintain the path at a temperature which permits current to pass sufficient to cause the heating.

Upon further increase of the potential of source U, a stronger current will flow through the path 6 thus further increasing the heating of the region thereof. This causes heating of adjacent regions and the diameter of the current path will increase and the path will now be as indicated by diameter $d_2$, path 7. This path 7 will be at such a temperature, having such a resistance that equilibrium conditions again obtain; as can be seen, a larger cross sectional area is available to carry the entire current.

FIG. 2 shows the temperature distribution along the diameter of body 3 for various currents I in schematic form. Assume that the switching temperature is $T_S$ (see also FIG. 4), then it may be considered that any temperature above $T_S$ causes the element, or regions thereof, to switch into its low resistance state. With a current $I_1$, a current path of a small diameter, $d_1$, will be in the low resistance state. As the current increases to a value $I_2$, causing greater heating, the current path will likewise increase to a diameter $d_2$. If the temperature of $T_1$ is exceeded, however, then the resistance of the particular path itself further increases. This increase in resistance first occurs in the center region of the path as this is the area from which heat conduction is worst. The current distribution within the semi-conductor body thus changes so that in an outside region, in the form of a ring, the current density may be greater than within the central core. This further increases the cross sectional area of the current path within the body and prevents overloading of the body by excessive temperature rises.

FIG. 3 illustrates a typical voltage-current diagram of a semi-conductor switching element in accordance with the present invention. The current through the element is very small due to the very high resistance of the element. As the applied potential U increases, the current increases proportionately, as determined by the resistance. When the potential reaches the threshold value $U_S$, switching occurs as above described. The current rises rapidly and is essentially determined only by the value of the load resistance 1. As the voltage decreases, assuming an applied source of alternating current potential, the current will drop proportionately. When a value $I_H$ is reached, the current through the element is insufficient to maintain heating and the element will switch back to its high resistance state. The value of current $I_H$ may be termed the holding current; a current just above this holding current is necessary to maintain the temperature conditions within the semi-conductor element still providing for a current path 6. The temperature condition of the element itself is independent of the direction of current and the semi-conductor switching element is thus absolutely symmetrical as is clearly apparent from FIG. 3. If source U, FIG. 1, is an alternating source, then the current through the element 2 will cycle in the direction indicated by the arrows in FIG. 3. In other words, the switching element switches from a high resistance value to a low resistance value when a certain threshold voltage is exceeded, and remains in this low resistance value until just before the voltage goes through null, that is until the holding current is no longer passing through the element.

FIG. 5 shows an example of a semi-conductor switching element, in which a semi-conductor body 9 is applied to a plate electrode 8. The other side of the semi-conductor body 9 has a partly circular, strip form electrode 10 applied thereto, somewhat in the shape of a C. Electrode 10 is slightly depressed within body 9 near one of its terminal points as shown at 11. Thus, point 11 determines a point of lower resistance, since the path length between electrodes is less than at other points, thus also determining a point of higher current and greater heating. This point thus is the initiation point for the current to flow through the element. As the current increases through the element, the current path itself can increase only in the shape determined by the form of electrode 10. In its largest extent, the low resistance current path is in form of a strip, below the electrode, bent partially in circular form. This means that this current path has adjacent to it high resistance material in which no heat is generated, thus permitting the heat generated within the low resistance path to be carried to the outside rapidly. An element constructed in accordance with this embodiment has very small switching inertia, that means it has a rapid switching time.

Semi-conductor materials for use in the present invention may be of various kinds, provided that their resistance and heat characteristics conform to the requirements. As an example, mixtures of arsenic, sulfur and selenium; arsenic, phosphorus and selenium; zinc, arsenic and silicon; zinc, arsenic and germanium; cadmium, arsenic and silicon; and cadmium, arsenic and germanium are suitable. Most of these materials can readily be sintered, or an alloy melt may be permitted to solidify. They can also be evaporated on a substrate, such as electrode plate 4 (FIG. 1) or plate 8 (FIG. 5). These materials may be in single crystal form, they may be polycrystalline, or they may be amorphous.

Semi-conductor switching element in accordance with the present invention may be quite small; representative dimensions, given here by way of example only, may be as follows (with reference to FIG. 1):

$d_0$=1–5 mm.
distance between electrodes 4 and 5=100 microns
current carrying capacity=0.1 amp.

I claim:

1. Semiconductor static switching element capable of switching between a high resistance state and a low resistance state comprising, a junctionless, single layer of solid semiconductor material having a negative temperature coefficient of resistance, said semiconductor material consisting of a composition having a resistance-temperature characteristic which is sharply negative in a first range of temperatures and then slightly positive in a further range of higher temperatures, a pair of electrodes applied to opposite sides of said layer without forming a barrier therewith, means to apply a varying potential to said electrodes above a predetermined threshold value to cause a quiescent current to flow therebetween, said electrodes covering mutually superimposed centrally located areas of said semiconductor material layer so that the quiescent current is uniformly distributed over the cross section of said layer of semiconductor material beneath said superimposed electrodes and defining with said semiconductor material a low resistance path having a cross section small with respect to the region of flow of said quiescent current will be formed upon localized heating within the layer of semiconductor material due to increase in current through said semiconductor material upon increase of potential across said electrodes beyond said predetermined threshold value, said semiconductor material composition having a low heat conductivity, and the heat within said path will not be conducted outwardly away therefrom readily whereby an operating state of temperature necessary for the switching function is rapidly achieved.

2. Semiconductor switching element according to claim 1, wherein one of said electrodes is in strip form depressed into said semiconductor material so that said path is the shortest path between said electrodes, and said one electrode being substantially C shaped.

3. Semiconductor switching element according to claim 1, in which one of said electrodes has a portion spaced a lesser distance from the other electrode than the remainder of said one electrode, and said portion determining a path of lesser length between the electrodes and thereby determining said low resistance path.

4. Semiconductor static switching element according to claim 1, in which said semiconductor material composition consists of arsenic, sulfur and selenium, or zinc, arsenic and silicon, or arsenic, phosphorous and selenium or zinc, arsenic and germanium or cadmium, arsenic and silicon, or cadmium, arsenic and germanium.

References Cited

UNITED STATES PATENTS

| | | | |
|---|---|---|---|
| 3,271,591 | 9/1966 | Ovshinsky | 307—88.5 |
| 3,284,676 | 11/1966 | Hideo Izumi | 317—234 |
| 3,327,302 | 6/1967 | Ovshinsky | 340—347 |
| 3,336,484 | 8/1967 | Ovshinsky | 317—234 |

JOHN W. HUCKERT, Primary Examiner

R. SANDLER, Assistant Examiner

U.S. Cl. X.R.

29—573